(12) United States Patent
Wu et al.

(10) Patent No.: US 12,538,831 B2
(45) Date of Patent: Jan. 27, 2026

(54) ELECTRONIC DEVICE AND MANUFACTURING METHOD THEREOF

(71) Applicant: Innolux Corporation, Miaoli County (TW)

(72) Inventors: Tzu-Sheng Wu, Miaoli County (TW); Haw-Kuen Liu, Miaoli County (TW); Chung-Jyh Lin, Miaoli County (TW); Cheng-Chi Wang, Miaoli County (TW); Wen-Hsiang Liao, Miaoli County (TW); Te-Hsun Lin, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 507 days.

(21) Appl. No.: 17/993,905

(22) Filed: Nov. 24, 2022

(65) Prior Publication Data

US 2024/0120304 A1    Apr. 11, 2024

(30) Foreign Application Priority Data

Oct. 11, 2022  (CN) .......................... 202211239024.3

(51) Int. Cl.
*H01L 23/00*    (2006.01)
*H01L 25/10*    (2006.01)
*H01L 25/16*    (2023.01)

(52) U.S. Cl.
CPC .............. *H01L 24/13* (2013.01); *H01L 24/03* (2013.01); *H01L 24/05* (2013.01); *H01L 24/06* (2013.01);

(Continued)

(58) Field of Classification Search
CPC .......... H01L 24/13; H01L 24/03; H01L 24/05
See application file for complete search history.

(56) References Cited

U.S. PATENT DOCUMENTS 9,607,958 B2    3/2017  Lin et al.
10,504,852 B1 *  12/2019  Chen ................... H01L 25/0657
(Continued)

FOREIGN PATENT DOCUMENTS

| CN | 111462622 A | * | 7/2020 | ............. G09F 9/335 |
| CN | 114464576 A | * | 5/2022 | ........... H01L 23/544 |

(Continued)

OTHER PUBLICATIONS

"Office Action of Taiwan Counterpart Application", issued on Jul. 5, 2023, p. 1-p. 7.

(Continued)

*Primary Examiner* — Laura M Menz
(74) *Attorney, Agent, or Firm* — JCIPRNET (57) ABSTRACT

The disclosure provides an electronic device and a manufacturing method thereof. The electronic device includes a package structure, a circuit structure, a bonding structure and an external element. The circuit structure is disposed on the package structure and is electrically connected to the package structure. The circuit structure has a recess. The bonding structure includes a first bonding pad and a second bonding pad. The second bonding pad is disposed in the recess, and the second bonding pad is disposed on the first bonding pad. The bonding structure is disposed between the circuit structure and the external element. The external element is electrically connected to the circuit structure through the bonding structure. A width of the first bonding pad is smaller than a width of the second bonding pad.

18 Claims, 7 Drawing Sheets

(52) U.S. Cl.
CPC .............. *H01L 24/16* (2013.01); *H01L 24/17* (2013.01); *H01L 25/105* (2013.01); *H01L 25/16* (2013.01); *H01L 2224/034* (2013.01); *H01L 2224/0362* (2013.01); *H01L 2224/05005* (2013.01); *H01L 2224/05017* (2013.01); *H01L 2224/05018* (2013.01); *H01L 2224/05082* (2013.01); *H01L 2224/05541* (2013.01); *H01L 2224/05557* (2013.01); *H01L 2224/05558* (2013.01); *H01L 2224/05573* (2013.01); *H01L 2224/0603* (2013.01); *H01L 2224/13005* (2013.01); *H01L 2224/13082* (2013.01); *H01L 2224/16148* (2013.01); *H01L 2224/16225* (2013.01); *H01L 2224/16265* (2013.01); *H01L 2224/17163* (2013.01); *H01L 2225/1041* (2013.01); *H01L 2225/1058* (2013.01); *H01L 2924/19041* (2013.01); *H01L 2924/19043* (2013.01)

(56) References Cited

U.S. PATENT DOCUMENTS

| | | | | |
|---|---|---|---|---|
| 10,510,650 | B2 * | 12/2019 | Yu | H01L 23/5383 |
| 10,672,674 | B2 * | 6/2020 | Yu | H01L 22/32 |
| 11,694,967 | B2 * | 7/2023 | Wang | H01L 21/4853 |
| | | | | 257/668 |
| 11,908,836 | B2 * | 2/2024 | Chen | H01L 21/568 |
| 12,154,848 | B2 * | 11/2024 | Tsao | H01L 23/49838 |
| 2012/0206160 | A1 * | 8/2012 | Wu | G01R 31/2884 |
| | | | | 324/756.07 |
| 2016/0212852 | A1 * | 7/2016 | Hu | G06V 40/1318 |
| 2019/0006309 | A1 * | 1/2019 | Jeng | H01L 21/568 |
| 2019/0244947 | A1 * | 8/2019 | Yu | H01L 21/486 |
| 2019/0259726 | A1 * | 8/2019 | Jeng | H01L 25/0652 |
| 2020/0161267 | A1 * | 5/2020 | Jeng | H01L 21/56 |
| 2020/0294930 | A1 * | 9/2020 | Wang | H01L 23/49811 |
| 2020/0388564 | A1 * | 12/2020 | Chou | H01L 24/73 |
| 2022/0108967 | A1 * | 4/2022 | Jeng | H01L 23/3135 |
| 2022/0223564 | A1 * | 7/2022 | Chen | H01L 25/105 |
| 2023/0132292 | A1 * | 4/2023 | Yan | H10H 20/01 |
| | | | | 438/4 |
| 2023/0290733 | A1 * | 9/2023 | Wang | H01L 21/568 |
| 2023/0395573 | A1 * | 12/2023 | Chen | H01L 23/544 |
| 2024/0006367 | A1 * | 1/2024 | Jeng | H01L 21/56 |
| 2024/0047422 | A1 * | 2/2024 | Chen | H01L 24/09 |
| 2024/0120304 | A1 * | 4/2024 | Wu | H01L 23/5389 |
| 2024/0145372 | A1 * | 5/2024 | Tsao | H01L 23/3185 |
| 2024/0162185 | A1 * | 5/2024 | Huang | H01L 24/16 |
| 2024/0266335 | A1 * | 8/2024 | Li | H01L 25/50 |
| 2024/0363565 | A1 * | 10/2024 | Chang | H01L 24/80 |
| 2024/0387467 | A1 * | 11/2024 | Chen | H01L 23/481 |
| 2024/0429193 | A1 * | 12/2024 | Chou | H01L 24/20 |
| 2025/0038097 | A1 * | 1/2025 | Tsao | H01L 23/3185 |
| 2025/0167158 | A1 * | 5/2025 | Jeng | H01L 21/6835 |

FOREIGN PATENT DOCUMENTS

| | | | | | |
|---|---|---|---|---|---|
| CN | 117913055 | A | * | 4/2024 | ............ H01L 24/81 |
| CN | 119181674 | A | * | 12/2024 | ............ H01L 23/28 |
| KR | 102720771 | B1 | * | 10/2024 | ........... H01L 25/105 |
| KR | 20250001949 | A | * | 1/2025 | ............ F21V 23/001 |
| TW | 200532824 | | | 10/2005 | |
| TW | 201709406 | | | 3/2017 | |
| TW | I610405 | | | 1/2018 | |
| TW | 202109818 | | | 3/2021 | |
| TW | 202205455 | | | 2/2022 | |
| TW | I835336 | B | * | 3/2024 | |
| TW | 202416486 | A | * | 4/2024 | |
| TW | 202431577 | A | * | 8/2024 | |
| TW | 202501769 | A | * | 1/2025 | ......... H01L 23/3135 |
| WO | WO-2025005747 | A1 | * | 1/2025 | ............ F21S 41/19 |
| WO | WO-2025005749 | A1 | * | 1/2025 | ............ F21K 9/238 |
| WO | WO-2025005752 | A1 | * | 1/2025 | ............ F21K 9/238 |

OTHER PUBLICATIONS

"Office Action of Taiwan Related Application, Application No. 113105857", issued on Sep. 4, 2025, p. 1-p. 5.

* cited by examiner

ELECTRONIC DEVICE AND MANUFACTURING METHOD THEREOF

CROSS-REFERENCE TO RELATED APPLICATION

This application claims the priority benefit of China application serial no. 202211239024.3, filed on Oct. 11, 2022. The entirety of the above-mentioned patent application is hereby incorporated by reference herein and made a part of this specification.

BACKGROUND

Technical Field

The disclosure relates to an electronic device and a manufacturing method thereof, and in particular relates to an electronic device that may reduce stress or improve reliability and a manufacturing method thereof.

Description of Related Art

Electronic devices or spliced electronic devices have been widely used in various fields such as communication, display, automotive, high-speed computing, power management, or aviation, etc. With the vigorous development of electronic devices, the electronic devices are being developed towards thinness and lightness, which has led to higher requirements for the reliability or quality of the electronic devices.

SUMMARY

According to an embodiment of the disclosure, an electronic device includes a package structure, a circuit structure, a bonding structure, and an external element. The circuit structure is disposed on the package structure and is electrically connected to the package structure. The circuit structure has a recess. The bonding structure includes a first bonding pad and a second bonding pad. The first bonding pad is disposed in the recess, and the second bonding pad is disposed on the first bonding pad. The bonding structure is disposed between the circuit structure and the external element. The external element is electrically connected to the circuit structure through the bonding structure. A width of the first bonding pad is smaller than a width of the second bonding pad.

According to an embodiment of the disclosure, a manufacturing method of an electronic device includes the following operation. A substrate is provided. A package structure is formed on the substrate. A circuit structure is formed so that a circuit structure is electrically connected to the package structure. A bonding structure is formed on the circuit structure. The bonding structure includes a first bonding pad and a second bonding pad, and the first bonding pad is disposed between the second bonding pad and the circuit structure. An external element is disposed, so that the bonding structure is located between the circuit structure and the external element, and the external element is electrically connected to the circuit structure. A width of the first bonding pad is smaller than a width of the second bonding pad.

BRIEF DESCRIPTION OF THE DRAWING

The accompanying drawings are included to provide a further understanding of the disclosure, and are incorporated in and constitute a part of this specification. The drawings illustrate embodiments of the disclosure, and together with the description serve to explain principles of the disclosure.

DETAILED DESCRIPTION OF DISCLOSED EMBODIMENTS

The disclosure may be understood by referring to the following detailed description in conjunction with the accompanying drawings. It should be noted that, for the ease of understanding by the readers and for the brevity of the accompanying drawings, multiple drawings in the disclosure only depict a portion of the electronic device, and the specific elements in the drawings are not drawn according to the actual scale. In addition, the number and size of each of the elements in the figures are for illustration purposes only, and are not intended to limit the scope of the disclosure.

In the following description and patent claims, words such as "comprising" and "including" are open-ended words, so they should be interpreted as meaning "including but not limited to . . . ".

It should be understood that when an element or layer is referred to as being "on" or "connected to" another element or layer, it may be directly on or directly connected to this other element or layer, or there may be an intervening element or layer in between (indirect case). In contrast, when an element is referred to as being "directly on" or "directly connected to" another element or layer, there are no intervening elements or layers present.

Although the terms "first", "second", "third", . . . may be used to describe various constituent elements, the constituent elements are not limited by the terms. The terms are only used to distinguish a single constituent element from other constituent elements in the specification. The same terms may not be used in the claim, but replaced by first, second, third . . . according to the order in which the elements are declared in the claim. Therefore, in the following description, the first constituent element may be the second constituent element in the claim.

The directional terms mentioned in the following description and the scope of the patent application, like "above", "below", "left", "right", "front", and "back", refer to the directions in the appended drawings. Therefore, the directional wordings are used to illustrate rather than limit the disclosure. It must be understood that the elements specifically described or illustrated may exist in various forms well known to those skilled in the art. As used herein, when an element is referred to as "overlapping" another element, it should be understood that the element partially or completely overlaps the other element.

As used herein, the terms "about," "approximately," "substantially," and "roughly" generally mean within 10%, within 5%, within 3%, within 2%, within 1%, or within 0.5% of a given value or range. The quantity given here is an approximate quantity, that is, even though "about," "approximately," "substantially," and "roughly" are not specified, the meaning of "about," "approximately," "substantially," and "roughly" are still implied.

In some embodiments of the disclosure, terms related to joining and connecting, such as "connected", "interconnected", etc., unless otherwise defined, may mean that two structures are in direct contact, or may also mean that two structures are not in direct contact, in which there are other structures located between these two structures. The terms related to joining and connecting may also include the case where both structures are movable, or both structures are fixed. Furthermore, the term "coupled" includes any direct and indirect means of electrical connection.

In some embodiments of the disclosure, optical microscopy (OM), scanning electron microscope (SEM), film thickness profiler (α-step), ellipsometer, or other suitable methods may be used to measure the area, width, thickness, or height of each element, or the distance or pitch between elements. In detail, according to some embodiments, a scanning electron microscope may be used to obtain a cross-sectional structure image including a component to be measured, and to measure the area, width, thickness, or height of each element, or the distance or pitch between elements.

In the disclosure, an electronic device may include a display device, a light-emitting device, a solar cell, an antenna device, a semiconductor device, a packaging device, a sensing device, an automotive device, or a splicing device, but is not limited thereto. The electronic device may be a bendable or flexible electronic device. The electronic device may, for example, include a liquid crystal light emitting diode; the light emitting diode may include, for example, an organic light-emitting diode (OLED), a mini light-emitting diode (mini LED), a micro light-emitting diode (micro LED), or a quantum dot light-emitting diode (quantum dot, QD, such as QLED, QDLED), fluorescence, phosphor, or other suitable materials, and the materials may be any arrangement and combination, but not limited thereto. The antenna device may be, for example, a liquid crystal antenna, but not limited thereto. The splicing device may be, for example, a display splicing device or an antenna splicing device, but not limited thereto. It should be noted that, the electronic device may be any arrangement and combination thereof, but not limited thereto. Hereinafter, an electronic device is used to illustrate the disclosure, but the disclosure is not limited thereto.

It should be noted that, in the following embodiments, the features in several different embodiments may be replaced, reorganized, and mixed to complete other embodiments without departing from the spirit of the disclosure. As long as the features of the various embodiments do not violate the spirit of the disclosure or conflict with one another, they may be mixed and matched arbitrarily.

References of the exemplary embodiments of the disclosure are to be made in detail. Examples of the exemplary embodiments are illustrated in the drawings. If applicable, the same reference numerals in the drawings and the descriptions indicate the same or similar parts.

Figure 1A:
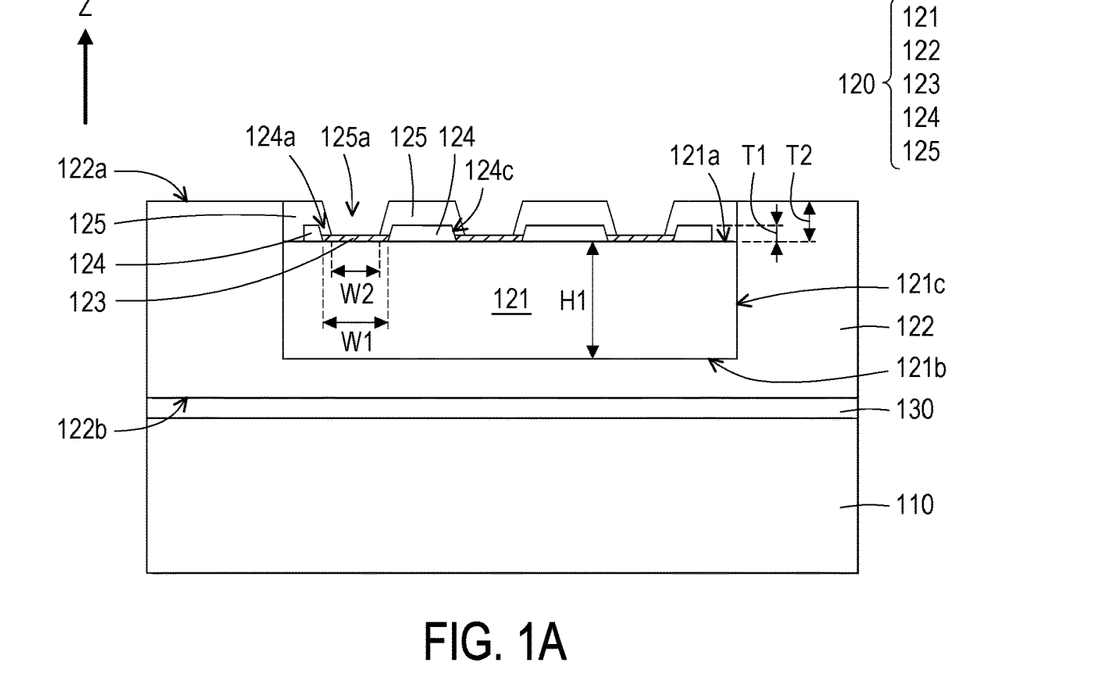
FIG. 1A to FIG. 1H are partial cross-sectional schematic views of a manufacturing method of an electronic device according to an embodiment of the disclosure.
Figure 1B:
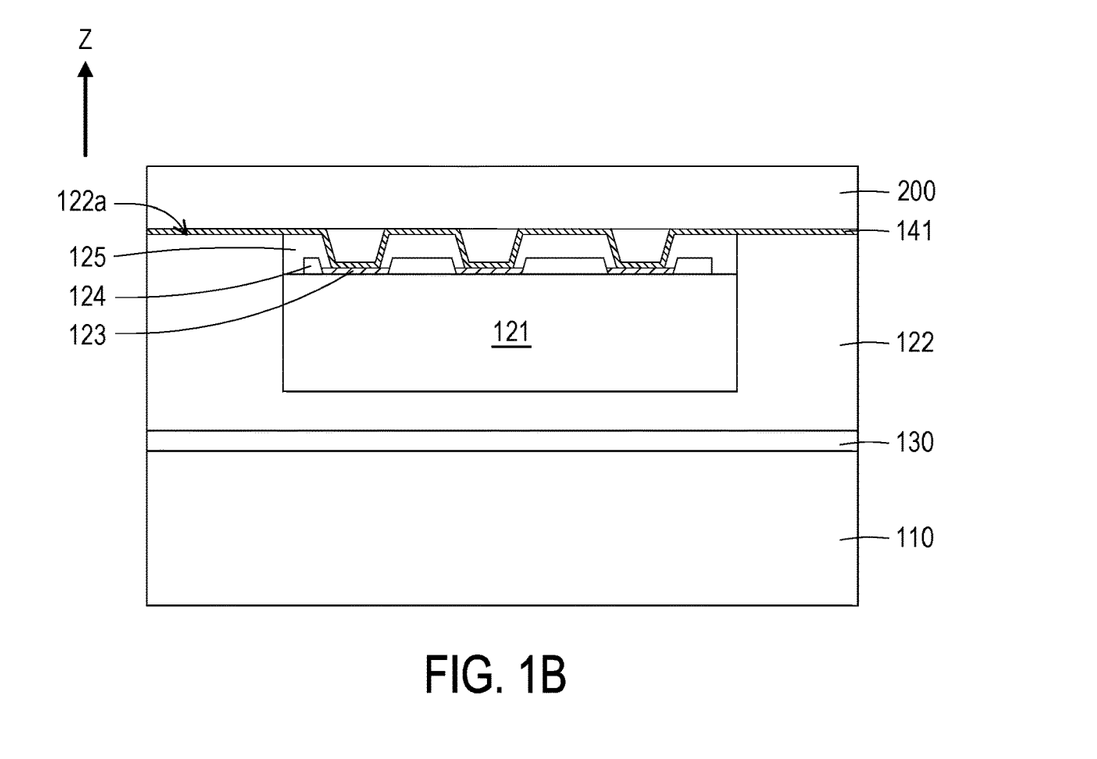
Figure 1C:
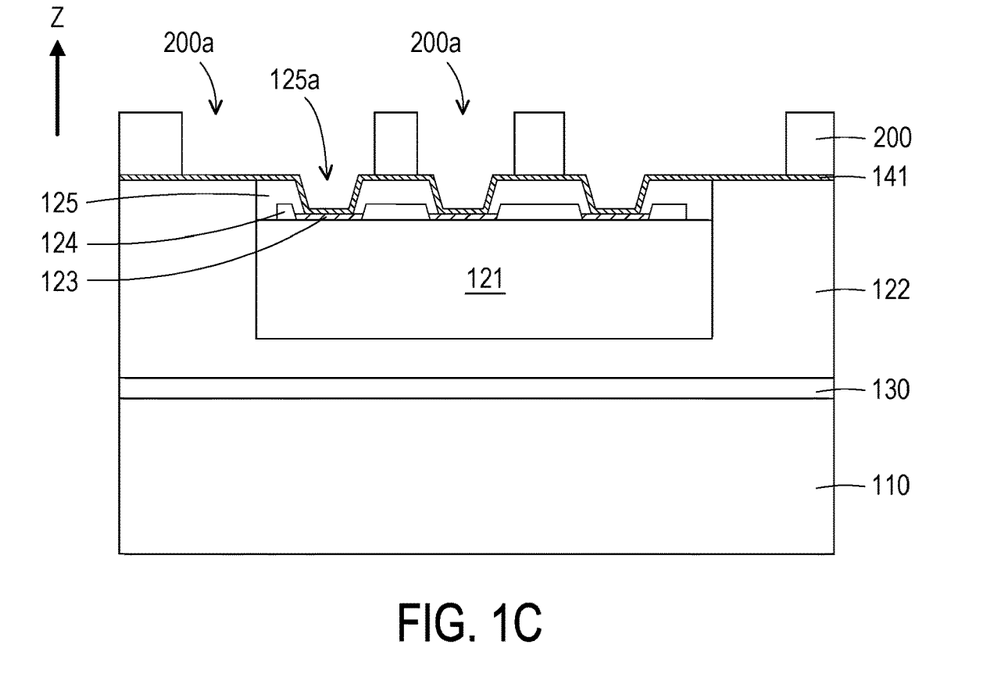
Figure 1D:
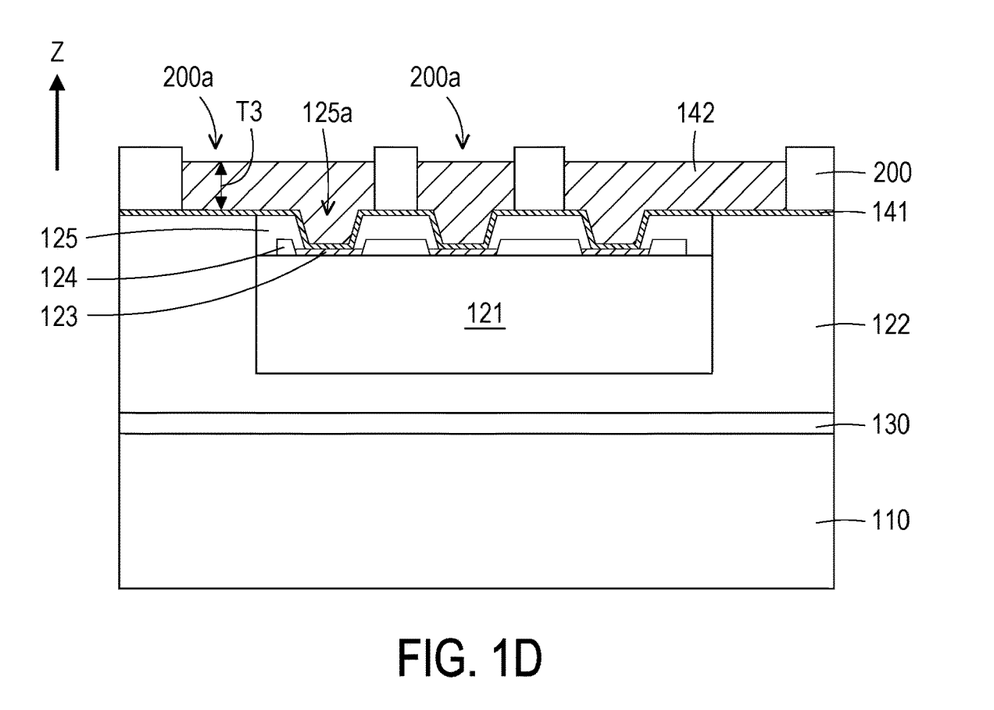
Figure 1E:
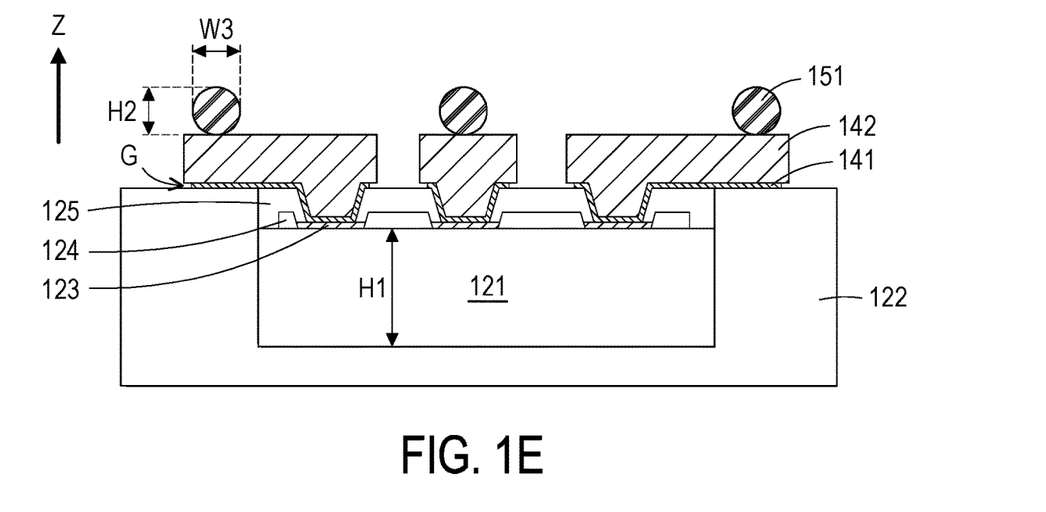
Figure 1F:
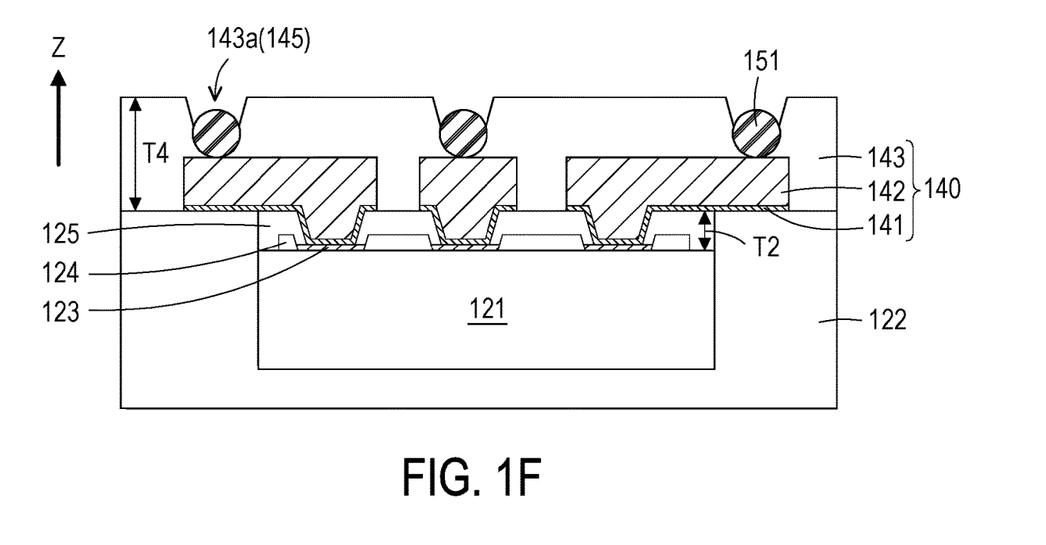
Figure 1G:
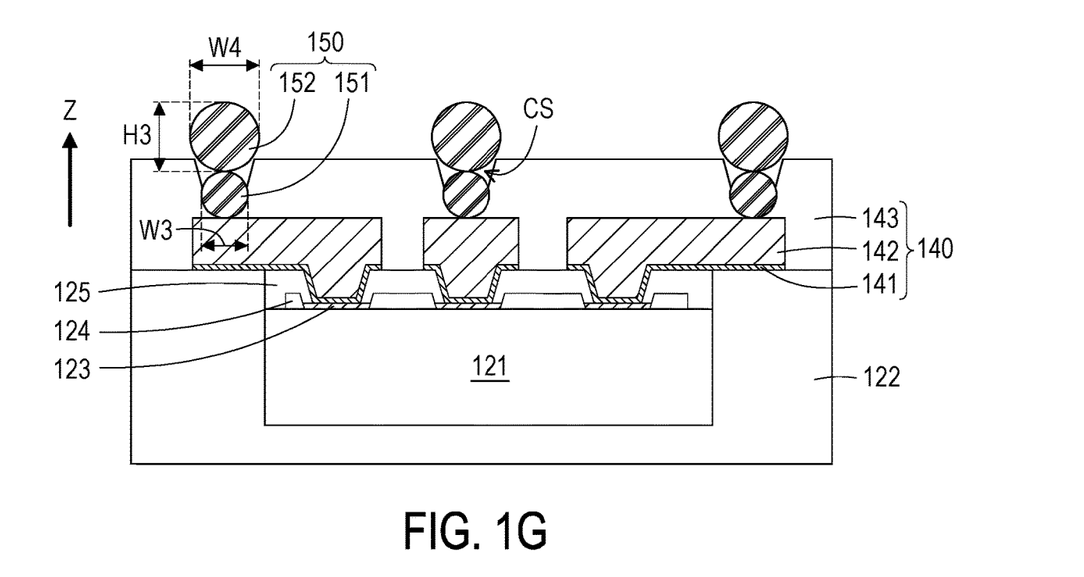
Figure 1H:
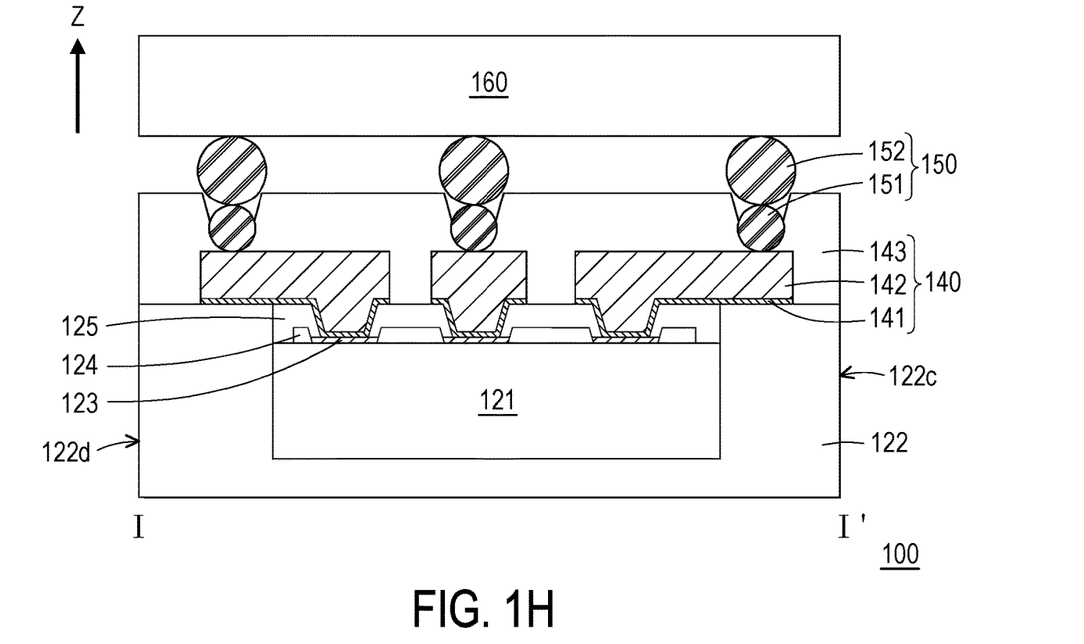
Figure 2:
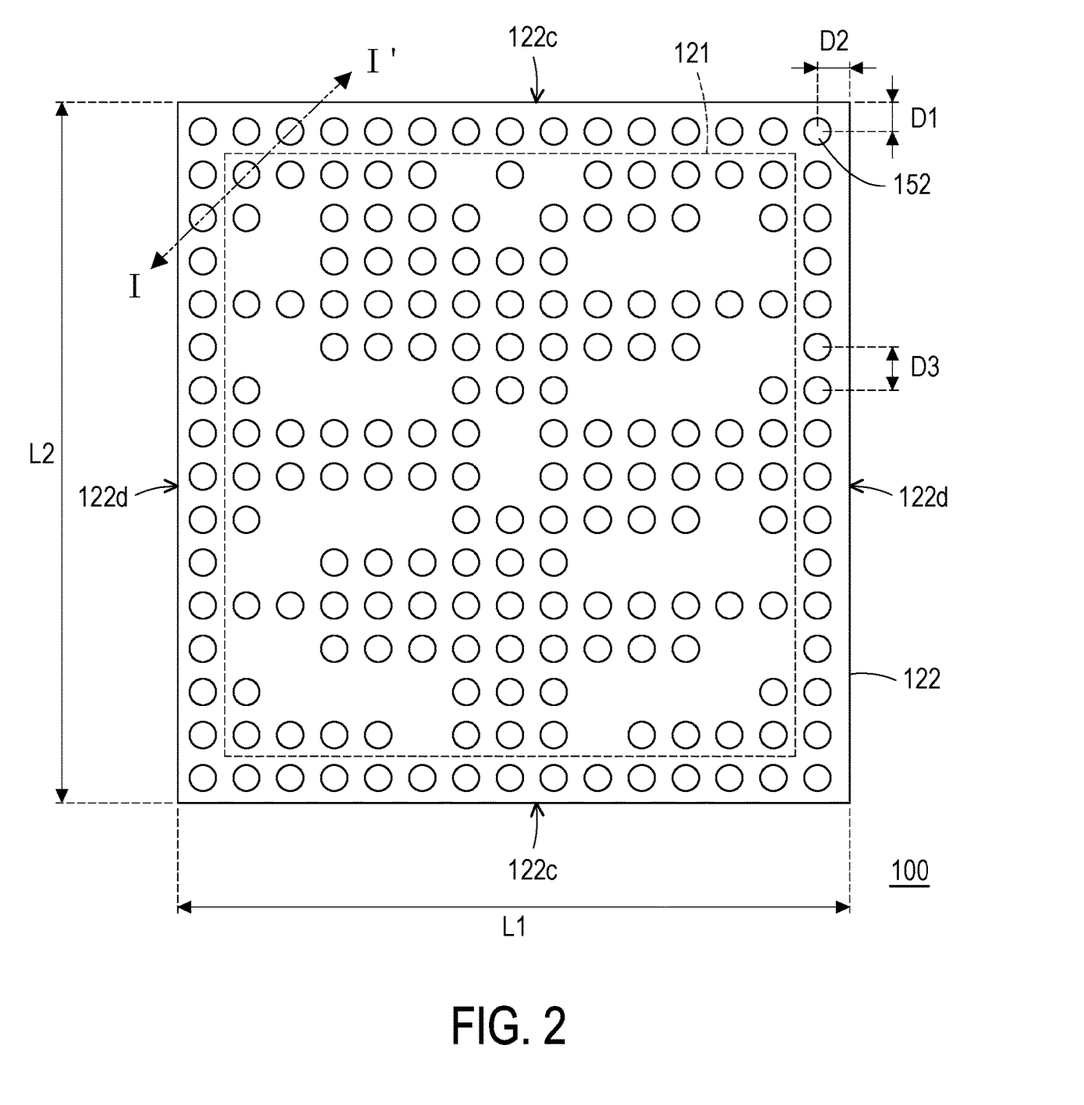
FIG. 2 is a top schematic view of the electronic device of FIG. 1H.

FIG. 1A to FIG. 1H are partial cross-sectional schematic views of a manufacturing method of an electronic device according to an embodiment of the disclosure. FIG. 2 is a top schematic view of the electronic device of FIG. 1H, and FIG. 1H is a cross-sectional schematic view of the electronic device of FIG. 2 along the section line I-I'. For the clarity of the drawings and the convenience of description, some elements of the electronic device 100 are omitted in FIG. 2 (e.g., the first bonding pad 151 and the external element 160 are omitted, but not limited thereto).

According to some embodiments of the disclosure, a manufacturing method of an electronic device 100 is provided hereafter.

First, referring to FIG. 1A, a substrate 110 is provided, and a package structure 120 is formed on the substrate 110. The substrate 110 may include a rigid substrate, a flexible substrate or a combination thereof. For example, the material of the substrate 110 may include glass, quartz, sapphire, ceramic, polycarbonate (PC), polyimide (PI), polyethylene terephthalate (PET), other suitable substrate materials, or a combination thereof, but not limited thereto. In addition, in this embodiment, the direction Z is, for example, the normal direction of the substrate 110 or the normal direction of the electronic device 100, but is not limited thereto.

In this embodiment, a release layer 130 may be selectively disposed between the substrate 110 and the package structure 120, but is not limited thereto. The release layer 130 may be removed together with the substrate 110 in a subsequent step. The material of the release layer 130 may include an adhesive material that loses its adhesive properties when heated or irradiated by ultraviolet light, but is not limited thereto. In some embodiments, a release layer may not be required between the substrate and the package structure.

In this embodiment, the package structure 120 includes an electronic element 121 and a protective layer 122 surrounding the electronic element 121. Specifically, the electronic element 121 has an upper surface 121a, a lower surface 121b opposite to the upper surface 121a, and a side surface 121c connecting the upper surface 121a and the lower surface 121b. The upper surface 121a may be, for example, the active surface of the electronic element 121, but is not limited thereto. Furthermore, the electronic element 121 has a height H1. The height H1 is, for example, the height of the electronic element 121 measured along the normal direction (i.e., the direction Z) of the substrate 110. In this embodiment, the height H1 of the electronic element 121 may be, for example, greater than or equal to 200 micrometers (μm) (i.e., H1≥200 μm), but is not limited thereto. In this embodiment, the electronic element 121 may include a chip (e.g., a known good die (KGD)), a diode, an antenna unit, a sensor, a structure related to a semiconductor process, or a structure of a semiconductor-related process disposed on a substrate (e.g., polyimide, glass, silicon substrate, or other suitable substrate materials), but not limited thereto.

The protective layer 122 surrounds the electronic element 121, that is, the protective layer 122 may contact at least one side surface 121c of the electronic element 121. The protective layer 122 may further contact the lower surface 121b of the electronic element 121. According to some embodiments, the protective layer 122 may contact the side surface 121c of the electronic element 121, but the protective layer 122 does not contact the lower surface 121b of the electronic element 121. The protective layer 122 has an upper surface 122a and a lower surface 122b opposite to each other. The lower surface 122b of the protective layer 122 may contact the release layer 130, but is not limited thereto. The material of the protective layer 122 may include an epoxy molding compound (EMC), other suitable protective materials, or a combination thereof, but is not limited thereto.

In this embodiment, the package structure 120 further includes a pad 123, a first insulating layer 124, and a second insulating layer 125. The pad 123 are disposed on the upper surface 121a of the electronic element 121, and the pad 123 may be electrically connected to the electronic element 121. The material of the pad 123 may include aluminum, titanium, copper, molybdenum, silver, gold, other suitable conductive materials, or a combination thereof, but is not limited thereto.

The first insulating layer 124 is disposed on the upper surface 121a of the electronic element 121. The first insulating layer 124 has a thickness T1. The thickness T1 is, for example, the maximum thickness of the first insulating layer 124 measured along the normal direction (i.e., the direction Z) of the substrate 110. In addition, the first insulating layer 124 has a first opening 124a, and the first opening 124a may expose the pad 123. The bottom of the first opening 124a has a width W1. The first insulating layer 124 may be a single-layer structure or a multi-layer structure, and the material of the first insulating layer 124 may include silicon oxide, silicon nitride, aluminum oxide, polyimide (PI), photosensitive polyimide (PSPI), other suitable inorganic materials, other suitable organic materials, or a combination thereof, but is not limited thereto.

The second insulating layer 125 is disposed on the first insulating layer 124 and in the first opening 124a. The second insulating layer 125 has a thickness T2. The thickness T2 is, for example, the maximum thickness of the second insulating layer 125 measured along the normal direction (i.e., the direction Z) of the substrate 110. In this embodiment, the thickness T1 of the first insulating layer 124 may be, for example, smaller than the thickness T2 of the second insulating layer 125, but not limited thereto. In this embodiment, by designing the thickness of the insulating layer close to the electronic element 121 to be thinner, that is, by designing the thickness T1 of the first insulating layer 124 to be smaller than the thickness T2 of the second insulating layer 125, the area of the fan-out may be increased, but not limited thereto. In addition, the second insulating layer 125 has a second opening 125a. The second opening 125a may overlap the first opening 124a in the normal direction of the substrate 110. The second opening 125a may expose a portion of the pad 123. The bottom of the second opening 125a has a width W2. In this embodiment, the width W1 of the first opening 124a may be, for example, greater than the width W2 of the second opening 125a, but is not limited thereto. Through the design above, the second insulating layer 125 may contact the side surface 124c of the first insulating layer 124 through the first opening 124a, thereby, for example, the interface contact area may be increased to improve the bonding strength or the reliability of the electronic device. In this embodiment, the protective layer 122 may also be disposed on the side surface of the second insulating layer 125 to surround the second insulating layer 125. The upper surface 122a of the protective layer 122 may be substantially flush with the surface of the second insulating layer 125 away from the substrate 110, but is not limited thereto. The second insulating layer 125 may be a single-layer structure or a multi-layer structure, and the material of the second insulating layer 125 may include polyimide (PI), photosensitive polyimide (PSPI), Ajinomoto build-up layer (ABF), other suitable polymer materials, or a combination thereof, but not limited thereto.

Then, referring to FIG. 1B to FIG. 1D, a circuit structure 140 is formed, so that the circuit structure 140 is electrically connected to the package structure 120. The circuit structure 140 includes at least one seed layer 141, at least one conductive layer 142, and at least one third insulating layer 143 (FIG. 1H schematically shows one layer of seed layer 141, one layer of conductive layer 142, and one layer of third insulating layer 143 as an example). The conductive layer 142 and the third insulating layer 143 may be alternately stacked along the direction Z. According to some embodiments, the circuit structure 140 may include a thin film transistor (TFT), and the thin film transistor may include a gate electrode, a source electrode, a drain electrode, a semiconductor layer, etc., but the disclosure is not limited thereto. In addition, the circuit structure 140 may have a recess 145. The seed layer, the conductive layer, and the insulating layer referred to in the disclosure may be a single-layer or a multi-layer stack. The seed layer and the conductive layer may include copper, titanium, molybdenum, aluminum, or other suitable materials. According to some embodiments, the circuit structure 140 is, for example, a redistribution structure for redistribution or increasing the fan-out range, which may be applied to semiconductor devices, but not limited thereto.

Specifically, referring to FIG. 1B, a seed layer 141 is formed on the protective layer 122, on the second insulating layer 125, and in the second opening 125a, and a mask 200 is disposed on the seed layer 141 to cover the seed layer 141. The material of the seed layer 141 may include titanium, copper, other suitable materials, or a combination thereof, but is not limited thereto. The material of the mask 200 may include photosensitive polyimide, Ajinomoto build-up layer, other suitable mask materials, or a combination thereof, but is not limited thereto.

Next, referring to FIG. 1C, the mask 200 is patterned to form multiple openings 200a. The opening 200a may at least expose a portion of the seed layer 141 on the second insulating layer 125 and the seed layer 141 in the second opening 125a. The opening 200a may overlap the second opening 125a in the normal direction (i.e., the direction Z) of the substrate 110. In this embodiment, the patterning method of the mask 200 may include photolithography or laser direct imaging, but is not limited thereto.

Next, referring to FIG. 1D, a conductive layer 142 is formed in the opening 200a and in the second opening 125a. The conductive layer 142 may be electrically connected to the electronic element 121 through the seed layer 141 and the pad 123. The conductive layer 142 has a thickness T3. The thickness T3 is, for example, the thickness of the conductive layer 142 measured along the normal direction (i.e., the direction Z) of the substrate 110. In this embodiment, the thickness T3 of the conductive layer 142 may be, for example, greater than or equal to 60 μm and less than or equal to 100 μm (i.e., 60 μm≤T3≤100 μm), but not limited thereto. The material of the conductive layer 142 may include copper, titanium, chromium, aluminum, gold, nickel, metal alloys thereof, other suitable conductive materials, or a combination thereof, but is not limited to. In some embodiments, the conductive layer 142 may be regarded as a metal stud that may be electrically connected to the electronic element 121.

Then, referring to FIG. 1E to FIG. 1G, a bonding structure 150 is formed on the circuit structure 140, in which the bonding structure 150 includes a first bonding pad 151 and a second bonding pad 152. Specifically, referring to FIG. 1E, the patterned mask 200 is removed. The seed layer 141 under the mask 200 is patterned through a yellow light etching process, the first bonding pad 151 is disposed on the conductive layer 142, and the substrate 110 and the release layer 130 are removed. The first bonding pad 151 may directly contact the conductive layer 142. The first bonding pad 151 may not overlap the side surface 121c of the electronic element 121 in the normal direction (i.e., the direction Z) of the substrate 110. The bonding interface between the first bonding pad 151 and the conductive layer 142 may have an intermetallic compound (IMC) (not shown). In this embodiment, the first bonding pad 151 may be a solder ball, but not limited thereto. The material of the first bonding pad 151 may include tin-silver (SnAg), nickel, gold, conductive paste, or a suitable conductive metal, but is not limited thereto. According to some embodiments, the seed layer 141 and the conductive layer 142 may have different etching rates, so that after the patterning process of the seed layer 141, the seed layer 141 shrinks inward to form the groove G; thereby, the third insulating layer 143 subsequently formed may be filled into the groove G, so as to improve the bonding strength of the interface. The groove G may be defined as a gap between the conductive layer 142 and the protective layer 122, and the groove G may be surrounded by the conductive layer 142, the seed layer 141, and the protective layer 122.

In this embodiment, the first bonding pad 151 has a height H2 and a width W3. The height H2 is, for example, the height of the first bonding pad 151 measured along the normal direction (i.e., the direction Z) of the substrate 110. The height H2 and the width W3 of the first bonding pad 151 may be, for example, greater than or equal to 60 μm and less than or equal to 100 μm (i.e., 60 μm≤H2≤100 μm, 60 μm≤W3≤100 μm), but not limited thereto. In addition, in this embodiment, in the cross-sectional view (as shown in FIG. 1E), the height H1 of the electronic element 121 may be, for example, greater than or equal to 3 times the height H2 of the first bonding pad 151 and less than or equal to 10 times the height H2 of the first bonding pad 151 (i.e., 3×H2≤H1≤10×H2), but not limited thereto.

In this embodiment, the first bonding pad 151 is disposed on the conductive layer 142 instead of the conventional method of forming metal studs on the conductive layer. Thereby, the steps of disposing the mask again, patterning the mask again, and removing the patterned mask again when forming the conventional metal studs may be omitted, which has the effect of simplifying the process or saving time.

In this embodiment, the first bonding pad 151 is disposed on the conductive layer 142 instead of the conventional method of forming metal studs on the conductive layer. Thereby, the stress caused by the mismatch of the coefficients of thermal expansion (CTE) may be reduced when bonding a heterogeneous interface, the risk of cracks at the heterogeneous interface may be reduced, or the reliability of the electronic device may be improved. Heterogeneous in the disclosure generally refers to layers or elements with different materials or functions.

Next, referring to FIG. 1F, a third insulating layer 143 is formed on the conductive layer 142. The third insulating layer 143 may cover the conductive layer 142, and the protective layer 122 and the second insulating layer 125 exposed by the conductive layer 142. The third insulating layer 143 may surround the first bonding pad 151 and the intermetallic compound between the first bonding pad 151 and the conductive layer 142 to increase the bonding strength between the first bonding pad 151 and the conductive layer 142. The third insulating layer 143 has an opening 143a, and the opening 143a may expose the first bonding pads 151. In this embodiment, the opening 143a of the third insulating layer 143 may be regarded as the recess 145 of the circuit structure 140. In some embodiments, when the circuit structure includes multiple insulating layers, the recess in the circuit structure may be regarded as the opening of the outermost insulating layer (i.e., the insulating layer in the circuit structure farthest from the package structure) in the circuit structure.

In this embodiment, the third insulating layer 143 has a thickness T4. The thickness T4 is, for example, the maximum thickness of the third insulating layer 143 measured along the stacking direction (i.e., the direction Z) of the conductive layer 142 and the third insulating layer 143. In this embodiment, the thickness T4 of the third insulating layer 143 may be, for example, greater than the thickness T2 of the second insulating layer 125, so that the rigidity (including hardness, Young's coefficient, etc.) of the third insulating layer 143 may be greater than the rigidity of the second insulating layer 125 to prevent scratches, chemical corrosion effects or moisture effects, but is not limited thereto.

In this embodiment, the step of forming the third insulating layer 143 on the conductive layer 142 may, for example, include the following steps. An insulating material (not shown) is first formed on the conductive layer 142 so that the insulating material may cover the conductive layer 142 and the first bonding pad 151. Next, the insulating material is grinded as required to planarize the insulating material of the surface away from the electronic element 121. Next, holes are punched in the insulating material at the position corresponding to the first bonding pad 151 to form the opening 143a that may expose the first bonding pad 151. In this embodiment, the third insulating layer 143 may have a single-layer structure or a multi-layer structure, and the material of the third insulating layer 143 may include photosensitive polyimide, Ajinomoto build-up layer, other suitable polymer materials, or a combination thereof, but not limited thereto.

Next, referring to FIG. 1G, the second bonding pad 152 is disposed in the recess 145, so that the second bonding pad 152 is disposed on the first bonding pad 151, and the first bonding pad 151 is disposed between the second bonding pad 152 and the conductive layer 142 of the circuit structure 140. The second bonding pad 152 may directly contact the first bonding pad 151. A portion of the second bonding pad 152 may be located within the recess 145, and another portion of the second bonding pad 152 may be located outside the recess 145. The contact surface CS between the second bonding pad 152 and the first bonding pad 151 may be located within the recess 145, and the contact surface CS may be lower than the surface of the third insulating layer 143 away from the package structure 120 in the normal direction (i.e., the direction Z) of the substrate 110, to fix the second bonding pad 152 or to limit the bonding position of the second bonding pad 152, thereby improving the alignment accuracy. According to some embodiments, the contact surface between the second bonding pad 152 and the first bonding pad 151 may be located outside the recess 145. The second bonding pad 152 may not overlap the side surface 121c of the electronic element 121 in the normal direction (i.e., the direction Z) of the substrate 110. In this embodiment, the second bonding pad 152 may be a solder ball, but not limited thereto. The material of the second bonding pad 152 may include, tin-silver, conductive paste, or a suitable conductive metal, but is not limited thereto.

In this embodiment, the second bonding pad 152 has a height H3 and a width W4. The height H3 and the width W4 of the second bonding pad 152 may be, for example, greater than or equal to 200 μm and less than or equal to 300 μm (i.e., 200 μm≤H3≤300 μm, 200 μm≤W4≤300 μm), but not limited thereto. In addition, in this embodiment, the width W3 of the first bonding pad 151 may be, for example, smaller than the width W4 of the second bonding pad 152, but is not limited thereto.

In this embodiment, although FIG. 1G schematically shows that the first bonding pad 151 is a single structure, and the single first bonding pad 151 may directly connect the second bonding pad 152 and the conductive layer 142, the disclosure does not limit the structure number of the first bonding pad 151. In some embodiments, the first bonding pad may also be a structure in which multiple sub-bonding pads (not shown) are stacked. The sub-bonding pads are all surrounded by the third insulating layer 143, the sub-bonding pad closest to the conductive layer 142 may directly contact the conductive layer 142, and the sub-bonding pad farthest from the conductive layer 142 may directly contact the second bonding pad 152.

Then, referring to FIG. 1H and FIG. 2, the external element 160 is disposed so that the bonding structure 150 is located between the circuit structure 140 and the external element 160, and the external element 160 is electrically connected to the circuit structure 140 through the bonding structure 150. The external element 160 may be electrically connected to the circuit structure 140 through the second bonding pad 152 and the first bonding pad 151 of the bonding structure 150. The external element 160 may include a printed circuit board, an integrated circuit chip, a capacitor, or a resistor, but is not limited thereto.

Referring to FIG. 2, the protective layer 122 further has a side surface 122c and a side surface 122d connected to each other. The length L1 of the side surface 122c may be, for example, greater than or equal to 6 millimeters (mm) and less than or equal to 6.2 mm (i.e., 6 mm≤L1≤6.2 mm), and the length L2 of the side surface 122d may be, for example, greater than or equal to 6.4 mm and less than or equal to 6.6 mm (i.e., 6.4 mm≤L2≤6.6 mm), but not limited thereto. The minimum distance D1 between the center of the second bonding pad 152 and the side surface 122c may be, for example, greater than or equal to 200 μm and less than or equal to 300 μm (i.e., 200 μm≤D1≤300 μm), and the minimum distance D2 between the center of the second bonding pad 152 and the side surface 122d may be, for example, greater than or equal to 200 μm and less than or equal to 300 μm (i.e., 200 μm≤D2≤300 μm), but is not limited thereto. In addition, in two adjacent second bonding pads 152, the minimum distance D3 between the center of one of the second bonding pads 152 and the center of the other second bonding pad 152 may be, for example, greater than or equal to 350 μm and less than or equal to 450 μm (i.e., 350 μm≤D3≤450 μm), is not limited thereto. So far, the electronic device 100 of this embodiment has been substantially manufactured.

Based on the above, the electronic device 100 of this embodiment may include a package structure 120, a circuit structure 140, a bonding structure 150, and an external element 160. The circuit structure 140 is disposed on the package structure 120 and is electrically connected to the package structure 120. The circuit structure 140 has a recess 145. The bonding structure 150 includes a first bonding pad 151 and a second bonding pad 152. The first bonding pad 151 is disposed in the recess 145, and the second bonding pad 152 is disposed on the first bonding pad 151. The bonding structure 150 is disposed between the circuit structure 140 and the external element 160. The external element 160 is electrically connected to the circuit structure 140. The width W3 of the first bonding pad 151 is smaller than the width W4 of the second bonding pad 152.

In addition, in the manufacturing method of the electronic device 100 of the embodiment, although a chip first manufacturing method is used as an example, in which the package structure 120 including the electronic element 121 is formed first, and then the circuit structure 140 is formed on the package structure 120, but this disclosure does not limit the disposition order of the electronic element 121 and the circuit structure 140. In some embodiments, the manufacturing method of the electronic device may also be a redistribution layer first (RDL first) manufacturing method, in which a circuit structure is formed first, and then electronic elements are disposed on the circuit structure.

Other embodiments are described below for illustrative purposes. It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 3:
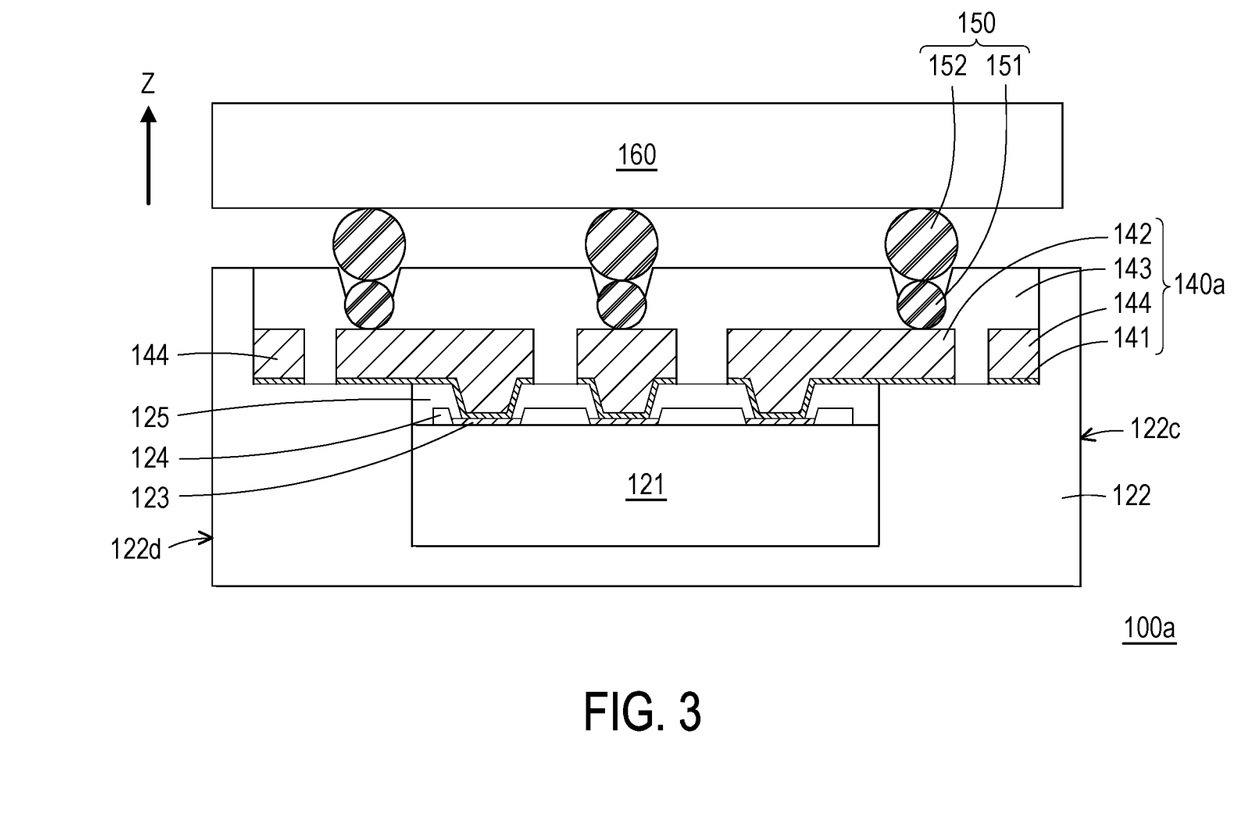
FIG. 3 is a partial cross-sectional schematic view of an electronic device according to another embodiment of the disclosure.

FIG. 3 is a partial cross-sectional schematic view of an electronic device according to another embodiment of the disclosure. Referring to FIG. 1H and FIG. 3 at the same time, the electronic device 100a of this embodiment is similar to the electronic device 100 of FIG. 1H, but the difference between the two is that in the electronic device 100a of this embodiment, the circuit structure 140a further includes a dummy metal 144.

Specifically, referring to FIG. 3, the dummy metal 144 and the conductive layer 142 may be the same film layer. The dummy metal 144 is closer to the side surface 122c or the side surface 122d of the protective layer 122 than the conductive layer 142. The dummy metal 144 is not electrically connected to the conductive layer 142. The dummy metal 144 may be used for alignment purposes. For example, the first bonding pad 151 may be aligned and disposed on the conductive layer 142 according to the position of the dummy metal 144. Furthermore, in some embodiments, in the top view of FIG. 3, the profile of the dummy metal 144 may be of any shape to serve as a mark for product traceability, but is not limited thereto.

Figure 4:
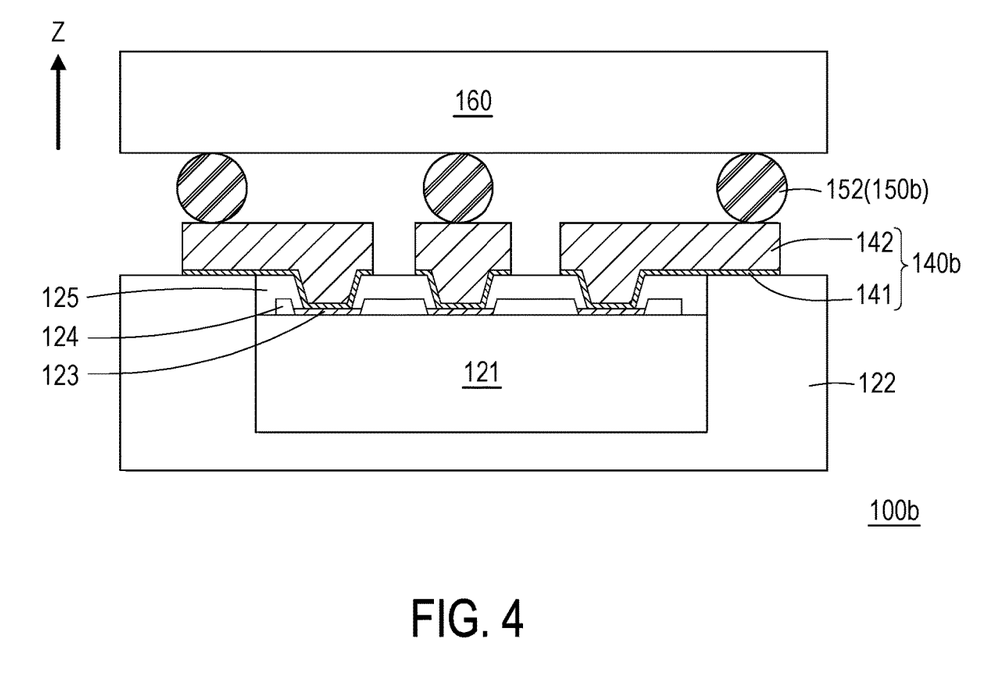
FIG. 4 is a partial cross-sectional schematic view of an electronic device according to another embodiment of the disclosure.

FIG. 4 is a partial cross-sectional schematic view of an electronic device according to another embodiment of the disclosure. Referring to FIG. 1H and FIG. 4 at the same time, the electronic device 100b of this embodiment is similar to the electronic device 100 of FIG. 1H, but the difference between the two is that in the electronic device 100b of this embodiment, the insulating layer and the first bonding pad may be omitted.

Specifically, referring to FIG. 4, the conductive layer 142 in the circuit structure 140b may be exposed, and the second bonding pad 152 in the bonding structure 150b may be directly disposed on the conductive layer 142. Thereby, the manufacturing process of the electronic device may be simplified or the cost may be saved.

To sum up, in the electronic device and the manufacturing method thereof of the embodiments of the disclosure, by replacing the conventional metal studs with the first bonding pad to be disposed between the second bonding pad and the conductive layer, the steps of disposing the mask again, patterning the mask again, and removing the patterned mask again when forming the conventional metal studs may be omitted, which has the effect of simplifying the process or saving time. By replacing the conventional metal studs with the first bonding pad to be disposed between the second bonding pad and the conductive layer, the stress caused by the mismatch of the coefficients of thermal expansion may be reduced when heterogeneous bonding, the risk of cracks at the heterogeneous bonding may be reduced, or the reliability of the electronic device may be improved.

Finally, it should be noted that the foregoing embodiments are only used to illustrate the technical solutions of the disclosure, but not to limit the disclosure; although the disclosure has been described in detail with reference to the foregoing embodiments, persons of ordinary skill in the art should understand that the technical solutions described in the foregoing embodiments may still be modified, or parts or all of the technical features thereof may be equivalently replaced; however, these modifications or substitutions do not deviate the essence of the corresponding technical solutions from the scope of the technical solutions of the embodiments of the disclosure.

What is claimed is:

1. An electronic device, comprising:
  a package structure, comprising:
    an electronic element;
    a protective layer, surrounding the electronic element;
    a first insulating layer, disposed on the electronic element and having a first opening; and
    a second insulating layer, disposed on the first insulating layer and having a second opening;
  a circuit structure, disposed on the package structure and electrically connected to the package structure, wherein the circuit structure has a recess;
  a bonding structure, comprising a first bonding pad and a second bonding pad, wherein the first bonding pad is disposed in the recess, and the second bonding pad is disposed on the first bonding pad; and
  an external element, wherein the bonding structure is disposed between the circuit structure and the external element, and the external element is electrically connected to the circuit structure through the bonding structure,
  wherein a width of the first bonding pad is smaller than a width of the second bonding pad,
  wherein the second insulating layer contacting a side surface of the first insulating layer through the first opening,
  wherein the external element contacts the second bonding pad, and the external element and the circuit structure are separated from each other,
  wherein the first bonding pad and second bonding pad comprise solder ball.

2. The electronic device according to claim 1, wherein in a cross-sectional view, a height of the electronic element is greater than or equal to 3 times a height of the first bonding pad and less than or equal to 10 times the height of the first bonding pad.

3. The electronic device according to claim 2, wherein a width of the first opening is greater than a width of the second opening.

4. The electronic device according to claim 1, wherein a thickness of the first insulating layer is smaller than a thickness of the second insulating layer.

5. The electronic device according to claim 1, the circuit structure having a third insulating layer, wherein a thickness of the third insulating layer is greater than a thickness of the second insulating layer.

6. The electronic device according to claim 5, the circuit structure further having a seed layer and a conductive layer, wherein the seed layer is disposed on the second insulating layer and in the second opening, and the conductive layer is disposed on the seed layer and in the second opening.

7. The electronic device according to claim 6, wherein the third insulating layer is disposed on the conductive layer, the third insulating layer has an opening, and the opening surrounds the first bonding pad.

8. The electronic device according to claim 6, the circuit structure comprising a dummy metal, wherein the dummy metal and the conductive layer is a film layer that is the same, and the dummy metal is not electrically connected to the conductive layer.

9. The electronic device according to claim 1, wherein the second bonding pad directly contacts the first bonding pad.

10. The electronic device according to claim 9, wherein a contact surface between the second bonding pad and the first bonding pad is located within the recess.

11. The electronic device according to claim 1, wherein the first bonding pad and the second bonding pad does not overlap a side surface of the electronic element in a normal direction of the electronic device.

12. A manufacturing method of an electronic device, comprising:
  providing a substrate;
  forming a package structure on the substrate, wherein the package structure comprises:
    an electronic element;
    a protective layer, surrounding the electronic element;
    a first insulating layer, disposed on the electronic element and having a first opening; and
    a second insulating layer, disposed on the first insulating layer and having a second opening;
  forming a circuit structure, so that the circuit structure is electrically connected to the package structure;
  forming a bonding structure on the circuit structure, wherein the bonding structure comprises a first bonding pad and a second bonding pad, and the first bonding pad is disposed between the second bonding pad and the circuit structure; and
  disposing an external element, so that the bonding structure is located between the circuit structure and the external element, and the external element is electrically connected to the circuit structure,
  wherein a width of the first bonding pad is smaller than a width of the second bonding pad,
  wherein the second insulating layer contacting a side surface of the first insulating layer through the first opening,
  wherein the external element contacts the second bonding pad, and the external element and the circuit structure are separated from each other, wherein the first bonding pad and second bonding pad comprise solder ball.

13. The manufacturing method of the electronic device according to claim 12, wherein forming the circuit structure comprises:
  forming a seed layer on the package structure;
  disposing a mask on the seed layer;
  patterning the mask, to form a plurality of openings;
  forming a conductive layer in the openings;
  removing the mask that is patterned and a portion of the seed layer; and
  after disposing the first bonding pad on the conductive layer, forming a third insulating layer on the conductive layer to surround the first bonding pad.

14. The manufacturing method of the electronic device according to claim 12, wherein in a cross-sectional view, a height of the electronic element is greater than or equal to 3 times a height of the first bonding pad and less than or equal to 10 times the height of the first bonding pad.

15. The manufacturing method of the electronic device according to claim 14, wherein a width of the first opening is greater than a width of the second opening.

16. The manufacturing method of the electronic device according to claim 12, wherein a thickness of the first insulating layer is smaller than a thickness of the second insulating layer.

17. The manufacturing method of the electronic device according to claim 12, wherein the second bonding pad directly contacts the first bonding pad.

18. The manufacturing method of the electronic device according to claim 17, wherein a contact surface between the second bonding pad and the first bonding pad is located within the recess.

* * * * *